United States Patent [19]
Roth

[11] Patent Number: 5,669,583
[45] Date of Patent: Sep. 23, 1997

[54] METHOD AND APPARATUS FOR COVERING BODIES WITH A UNIFORM GLOW DISCHARGE PLASMA AND APPLICATIONS THEREOF

[75] Inventor: John Reece Roth, Knoxville, Tenn.

[73] Assignee: University of Tennessee Research Corporation, Knoxville, Tenn.

[21] Appl. No.: 254,264

[22] Filed: Jun. 6, 1994

[51] Int. Cl.$^6$ .................................................. B64C 1/38
[52] U.S. Cl. ........................ 244/130; 244/205; 244/204
[58] Field of Search .................................. 244/198, 203, 244/204, 205, 130, 62; 60/203.1

[56] References Cited

U.S. PATENT DOCUMENTS

| | | | |
|---|---|---|---|
| 2,946,541 | 7/1960 | Boyd | 244/205 |
| 3,095,163 | 6/1963 | Hill | 244/205 |
| 3,162,398 | 12/1964 | Clauser et al. | 244/205 |
| 3,360,220 | 12/1967 | Meyer | 244/205 |
| 3,507,348 | 4/1970 | Aronson | 244/205 |
| 3,510,094 | 5/1970 | Clark . | |
| 4,469,932 | 9/1984 | Spiegelberg . | |
| 4,771,730 | 9/1988 | Tezuka . | |
| 4,919,968 | 4/1990 | Buhl et al. . | |
| 5,213,658 | 5/1993 | Ishida . | |
| 5,270,137 | 12/1993 | Kubota . | |

FOREIGN PATENT DOCUMENTS

| | | |
|---|---|---|
| 292582 | 8/1991 | Germany . |
| 58-200529 | 11/1983 | Japan . |
| 61-177374 | 8/1986 | Japan . |
| 62-2544 | 1/1987 | Japan . |
| 62-235339 | 10/1987 | Japan . |
| 2-312223 | 12/1990 | Japan . |
| 4-225226 | 8/1992 | Japan . |

OTHER PUBLICATIONS

Von Engel, A.; Seeliger, R.; and Steenbeck, M. On The Glow Discharge At High Pressure *Ziet, fur Physik*, vol. 85 (1993) pp. 144–160.

EPO Publication No. 0,068,775 Issue Date: Jan. 5, 1983 Inventor: Hata, et al.

EPO Publication No. 0,117,561 Issue Date: Sep. 5, 1984 Inventor: Akagi, et al.

Wakida, T.; Kawamura, H.; Han, L.; Hwan Kim K.; Gotto, T.; and Takagishi, T. Changes In Surface Properties of Poly(Ethylene Terepathalate) Treated With Low Temperature Plasma: Effect of Pretreatment With Dimethylformamide *Sen–I Gakkaishi*, vol. 42, No. 2 (1986).

Wakida, T.; Kawamura, H.; Song, J.C.; Goto, T.; and Takagishi T. Surface Free Energy of Poly(Ethylene Terepathalate) and Nylon 6 Films Treated With Low Temperature Plasma *Sen–I Gakkaishi*, vol. 43, No. 7 (1987).

Kogoma, M.; Kasai, H.; Takahashi, K.; Moriwaki, T.; and Okazaki, S. Wettability Control of FA Plastic Surface by $CF_4$–$O_2$ Plasma and Its Etching Effect *J. Phys. D: Appl. Phys.*, vol. 20 (1987).

Kanazawa, S.; Kogoma, M.; Moriwaki, T.; and Okazaki, S. Stable Glow Plasma at Atmospheric Pressure *J. Phys. D: Appl. Phys.*, vol. 21 (1988) pp. 838–840.

Rakowski, W. Plasma Modification of Wool Under Industrial Conditions *Melliand Textilberichte*, vol. 70 (1989).

Yokoyama, T.; Kogoma, M.; Moriwaki, T.; and Okazaki, S. The Mechanism of the Stabilization of Glow Plasma at Atmospheric Pressure *J. Phys. D: Appl. Phys.*, vol. 23, (1990).

(List continued on next page.)

*Primary Examiner*—Andres Kashnikow
*Assistant Examiner*—Tien Dinh
*Attorney, Agent, or Firm*—Weiser & Associates, P.C.

[57] ABSTRACT

Method and apparatus for covering a free-standing body with a uniform glow discharge plasma, particularly at atmospheric pressure. The method may be used to provide a body coated with such a plasma, and also to treat a workpiece.

23 Claims, 4 Drawing Sheets

(2 of 4 Drawing(s) in Color)

OTHER PUBLICATIONS

Kanda, N.; Kogoma, M.; Jinno, H.; Uchiyama, H.; and Okazaki, S. Atmospheric Pressure Glow Plasma and Its Application to Surface Treatment and Film Deposition *International Symposium on Plasma Chemistry*, Symposium Proceedings, vol. 3, Bochum, Germany, Aug. 4–9, 1991.

Liu, C.; Chen, D.; and Roth, J. R. Characteristics of a Steady–State, Low Power Glow Discharge at Atmospheric Pressure *APS Bulletin*, vol. 37, No. 6 (1992) p. 1563.

Roth, J. R.; Liu, C.; and Laroussi, M. Experimental Generation of a Steady–State Glow Discharge at Atmospheric Pressure Paper 5P–21 *Proc. 1992 IEEE International Conference on Plasma Science*, Tampa, FL, IEEE Catalog No. 92–TH0460–6, ISBN 0–7803 0716–X (1992), pp. 170–171.

Reitz, H.; Schwarz, R.; Salge, J. G. H. Power Modulation for Dielectric Barrier–Discharges Paper presented at *Twentieth Power Modulator Symposium*, 1992.

Rakowski, W. Effect and Cost of Plasma Treatment of Polypropylene Melt Blown Webs *Second Annual TANDEC Conference*, 13–16 Oct., 1992.

M.R. Malik, L.M. Weinstein and M.Y. Hussaini, "Ion Wind Drag Reduction", *AIAA 21st Aerospace Sciences Meeting (AIAA–83–0231)*, Reno, Nevada, Jan. 10–13, 1983.

Liu. C. Plasma–Related Characteristics of a Steady–State Glow Discharge at Atmospheric Pressure Presented at the *1993 Sigma XI Graduate Student Paper Competition, The University of Tennessee, Knoxville, Tennessee*, Mar. 4, 1993.

Roth, J. R.; Spence, P. D.; and Liu, C. Plasma–Related Characteristics of a Steady–State Glow Discharge at Atmospheric Pressure Paper 2P–18, *Proc. 1993 IEEE International Conference on Plasma Science*, Vancouver, B.C., IEEE Catalog No. 93–CH3334–0 ISBN 0–7803–1360–7 (1993), p. 129.

Roth, J. R.; Spence, P. D.; and Liu, C. Preliminary Measurements of the Plasma Properties of a One Atmosphere Glow Discharge Plasma Paper presented at *35th Annual Meeting of the APS Division of Plasma Physics*, Series II, vol. 38, No. 10 (1993), p. 1901.

METHOD AND APPARATUS FOR COVERING BODIES WITH A UNIFORM GLOW DISCHARGE PLASMA AND APPLICATIONS THEREOF

STATEMENT OF GOVERNMENT INTEREST

This invention was made with Government support under AFOSR Grant 89-0319 awarded by the Air Force. The Government has certain rights in this invention.

BACKGROUND OF THE INVENTION

The present invention relates to a method and apparatus for covering the surface of a free-standing body, particularly a vehicle such as an aircraft or a ship, with a uniform glow discharge plasma, and for the use of such plasma covering for various applications, including affecting the aerodynamic properties of the body by decreasing or increasing the drag of the body in the atmosphere. The invention also relates to methods and apparatus for treating a workpiece with such a plasma.

The term "plasma" usually describes a partially ionized gas composed of ions, electrons and neutral species. This state of matter may be produced by the action of either very high temperatures, or strong direct current (DC) or radio frequency (RF) electric fields. High temperature or "hot" plasmas are represented by stars, nuclear explosions and electric arcs. Glow discharge plasmas are produced by free electrons which are energized by an imposed DC or RF electric field and then collide with neutral molecules. These neutral molecule collisions transfer energy to the molecules and form a variety of active species which may include photons, excited atoms, metastables, individual atoms, free radicals, molecular fragments, monomers, electrons and ions.

Low power plasmas, such as dark discharges and coronas, have been used in the surface treatment of various materials. Because of their relatively low energy content, corona discharge plasmas can alter the properties of a material surface without damaging the surface.

Glow discharge plasmas represent another type of relatively low power density plasma. These glow discharge plasmas can produce useful amounts of visible and ultraviolet (UV) radiation. Glow discharge plasmas have the additional advantage therefore of producing visible and UV radiation in the simultaneous presence of active species. However, glow discharge plasmas have heretofore been successfully generated typically in low pressure or partial vacuum environments below 10 torr which may necessitate batch processing and the use of expensive vacuum systems.

The generation of low power density plasmas at one atmosphere is not new. Filamentary discharges between parallel plates in air at one atmosphere have been used in Europe to generate ozone in large quantities for the treatment of public water supplies since the late 19th century. Such filamentary discharges, while useful for ozone production, are of limited utility because the filaments are indicative of a non-uniform plasma with uneven properties and effects on exposed materials.

SUMMARY OF THE INVENTION

The present invention includes methods and apparatus for covering a body with a uniform glow discharge plasma. The invention also includes methods for treating a workpiece with such a glow discharge plasma. The invention further includes bodies which are covered with a glow discharge plasma.

The plasma may be formed in atmospheric air or in other gases at about one atmosphere of pressure, or at pressures below or above one atmosphere. The plasma may also be formed in the atmosphere above ground level, provided there is sufficient atmospheric gas in which to generate the plasma, or may be generated in other gases of such reduced pressures.

In accordance with the method of the present invention a steady-state one atmosphere glow discharge plasma is generated above the surface of a body in a gas. The body may have disposed thereon a first electrode terminal and a second electrode terminal, wherein the first electrode terminal is connected to a first pole of a radio frequency (RF) power source which has first and second opposite poles, and wherein the second electrode terminal is either connected to the second pole of said RF power source or is grounded. As used herein, the term "electrode terminal" is intended to encompass any suitable electrode means for use in generating an electric field. The plasma is generated by utilizing the RF power source to energize the first electrode terminal relative to the second electrode terminal with an RF driving voltage, wherein the voltage is high enough to generate an electric field above the surface of the body, and the applied frequency of the RF electric field is high enough to trap the positive ions of the plasma on electric field lines between the two electrode terminals, but not so high that the electrons of the plasma are also trapped during a half cycle of oscillation of the RF voltage. In this manner, plasma is produced in the gas above the surface of the body.

Many different types of bodies may be covered with a plasma glow discharge in accordance with the present invention. The body may be a vehicle designed for movement in the air (such as an aircraft) on the water (such as a ship) or on the ground (such as a car or truck).

The body may also be industrial equipment used for applying the glow discharge plasma to a workpiece being processed by the industrial equipment.

The method and apparatus of the present invention are suitable for use in atmospheric air. Such air may be at one atmosphere sea level pressure (760 torr), or at the greatly reduced pressures found higher in the atmosphere. Other gases in which a glow discharge plasma can form may also be used. These include, but are not limited to, the noble gases, such as helium, neon and argon, as well as carbon dioxide and nitrogen, or mixtures thereof.

In one embodiment of the present invention a steady-state uniform one atmosphere glow discharge plasma is generated on the surface of a body in the atmosphere. The body has an insulated metallic skin on which are disposed strip electrodes which are spaced from and generally parallel to each other. The adjacent strip electrodes are connected to opposite poles of a radio frequency (RF) power source. To generate the plasma, one or more of the strip electrodes connected to one pole of the RF power source are energized relative to one or more adjacent strip electrodes connected to the other pole. The driving current is of high enough voltage to generate the glow discharge above the surface of the body. A voltage of more than about 10 kV RMS per cm is suitable in one atmosphere of air. The current is of relatively low frequency. The frequency should be sufficiently high such that the ions generated in the plasma between the electrodes do not have time during a half cycle of oscillation along electric field lines to impact either electrode. On the other hand, the frequency should be sufficiently low such that the electrons of the plasma are not also trapped in the plasma, but have time to impact the body or otherwise leave the plasma during a half cycle of oscillation. A frequency in the range of about 100 Hz to about 30 kHz, depending on electric field and geometry as well as other factors discussed below has been found suitable. In this manner, the positive ion content of the plasma builds up, while the electrons can impact the body to build up a charge on the body. This acts to allow a steady state uniform glow discharge plasma to form above the body.

In another embodiment of the invention, at least a portion of the insulated metallic skin of the body is used as one of the electrodes for generating the plasma. That is, the skin of the body, or a portion of the skin, is connected to one pole of the RF power source, and thus acts as the first electrode. A second electrode is provided spaced from the first electrode, such that the plasma is generated between the electrodes. The second electrode may either be connected to the second pole of the RF power source, or may be grounded.

In a particular embodiment of the present invention, such a layer of plasma is applied to a moving vehicle, such as an aircraft, ship or car, to reduce the drag and otherwise improve the aerodynamic characteristics of the atmospheric boundary layer on the vehicles. This is accomplished by reducing the level of boundary layer turbulence and by suppressing the formation of turbulent vortices.

In another embodiment of the invention, the plasma is generated on the surface of a vehicle, such as an aircraft, to propagate along the surface of the vehicle (hereafter referred to as a "peristaltic" fashion) so as to alter the speed of the vehicle in relation to the surrounding atmosphere.

In addition, the plasma may be generated on the surface of a body, such as an aircraft, to prevent the formation of ice and to remove ice present on the body.

The glow discharge plasma may also be generated on the surface of a body, such as a vehicle at night or in low visibility conditions, to make the body more visible.

BRIEF DESCRIPTION OF THE DRAWINGS

The file of this patent contains at least one drawing or photograph executed in color. Copies of this patent with color drawing(s) or photograph(s) will be provided by the Patent and Trademark Office upon request and payment of the necessary fee.

DESCRIPTION OF THE PREFERRED EMBODIMENT

Figure 1:
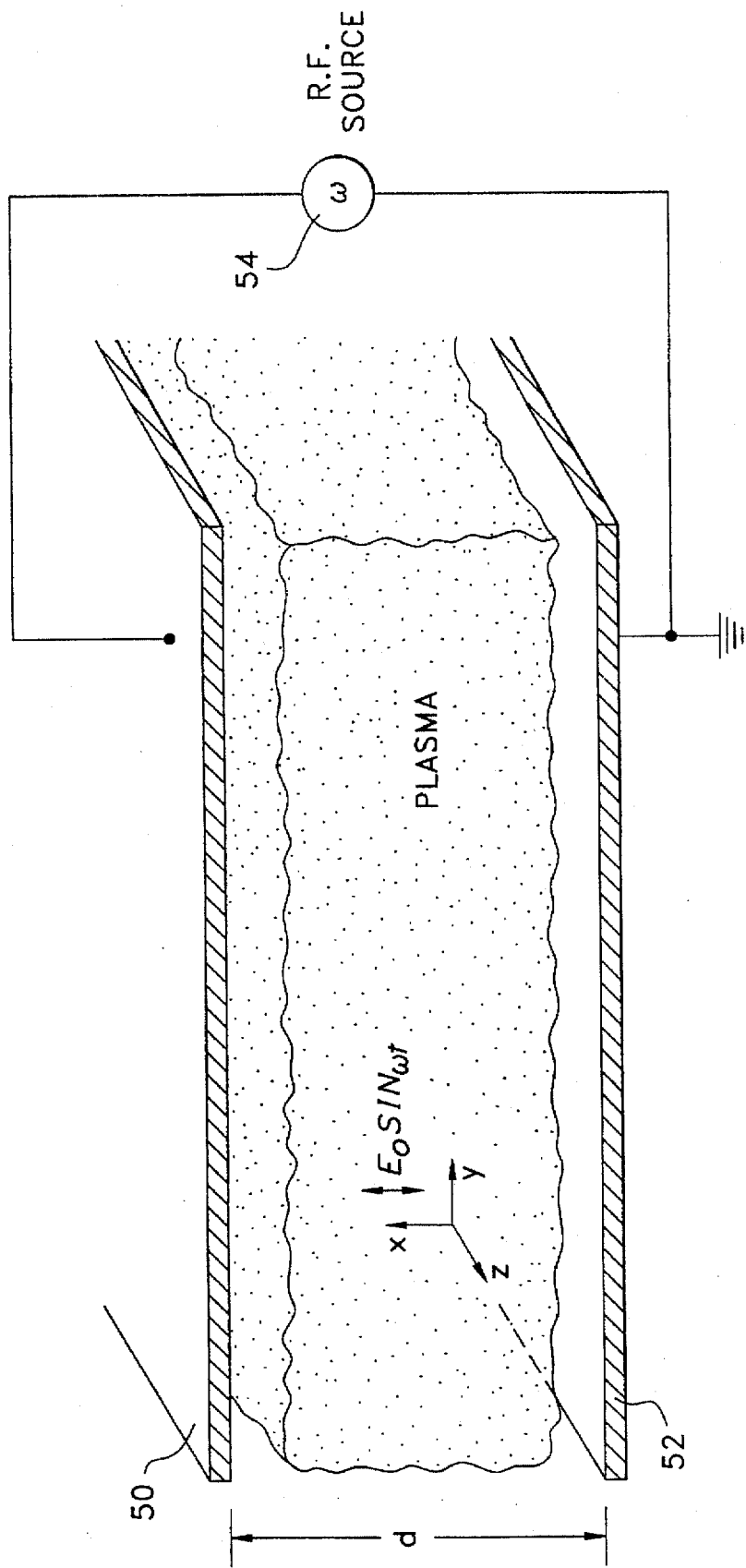
FIG. 1 is a schematic representation of apparatus for generating a plasma glow discharge between two plate electrodes.

The present invention includes methods and apparatus for covering a body with a uniform glow discharge plasma. The invention also includes methods for treating a workpiece with such a glow discharge plasma. The invention further includes bodies which are covered with a glow discharge plasma.

The plasma may be formed in atmospheric air or in other gases at about one atmosphere of pressure or below or above atmospheric pressure. The plasma may also be formed in the atmosphere above ground level, provided there is sufficient atmospheric gas in which to generate the plasma, or may be generated in other gases of such reduced pressures.

The methods and apparatus of the present invention are suitable for use in atmospheric air. Such air may be at one atmosphere sea level pressure (760 torr), or at the greatly reduced pressures found higher in the atmosphere. Other gases in which a glow discharge plasma can form may also be used. These include, but are not limited to, the noble gases, such as helium, neon and argon, as well as carbon dioxide and nitrogen, or mixtures thereof.

Many different types of bodies may be covered with a plasma glow discharge in accordance with the present invention. The body may be a vehicle designed for movement in the air (such as an aircraft) on the water (such as a ship) or on the ground (such as a car or truck).

The body may also be equipment used for applying the glow discharge plasma to a workpiece. The electrodes may be in the open when the plasma is to be generated in air. In those situations where an environmental risk may come about by exposure to the gases generated or otherwise, the apparatus and the work piece treated in accordance with the invention will advisedly be appropriately surrounded by a protective barrier. For instance, an enclosure of material like PLEXIGLAS can readily be provided for the equipment, with suitable inlet and outlet for the workpiece to be plasma treated. In cases in which the plasma gas is other than ambient air, the enclosure may be designed to also retain the treatment gas and prevent the surrounding air from entering the treatment zone.

In one embodiment of the present invention a steady-state uniform one atmosphere glow discharge is generated on the surface of a body in the atmosphere. The body can have the plasma generated on its outer surface or on an inner surface, as in a hollow tube. The body has an insulated metallic skin on which are disposed strip electrodes which are spaced from and generally parallel to each other. The adjacent strip electrodes are connected to opposite poles of a radio frequency (RF) power source. To generate the plasma, one or more of the strip electrodes connected to one pole of the RF power source are energized relative to one or more adjacent strip electrodes connected to the other pole. The driving current is of high enough voltage to generate electric fields above the surface of the vehicle, suitably of more than about 10 kV RMS per cm. The current is of relatively low frequency, suitably within the range of about 100 Hz to about 30 kHz. On one hand, the frequency should be sufficiently high such that the ions generated in the plasma above the insulated skin of the body and trapped on electric field lines do not have time during a half cycle of oscillation to impact the electrodes. On the other hand, the frequency should be sufficiently low such that the electrons of the plasma are not also trapped in the plasma, but have time to impact the electrode or skin or otherwise leave the plasma during a half cycle of oscillation. In this manner, the positive ion content of the plasma builds up, while the electrons can impact the insulated skin to build up a charge on the skin. This acts to allow a steady quasi-neutral state uniform glow discharge plasma to form above the insulated skin.

This embodiment of the invention could be used on a vehicular body, such as an aircraft, ship or terrestrial vehicle, in which the strip electrodes would be applied to the outer skin of the vehicle to generate a glow discharge plasma on the exterior of the vehicle. This embodiment could also be used on various types of industrial equipment.

In another embodiment of the invention, at least a portion of the insulated metallic skin of the body is used as one of the electrodes for generating the plasma. That is, the skin of the body, or a portion of the skin, is connected to one pole of the RF power source, and thus acts as the first electrode. A second electrode is provided spaced from the first electrode, such that the plasma is generated between the electrodes. The second electrode may either be connected to the second pole of the RF power source, or may be grounded.

In accordance with this embodiment, the first electrode may be a first portion of the insulated skin of the body, and the second electrode may be a second portion of the metallic skin which is electrically isolated from the first portion. In such an embodiment, the RF driving voltage is applied between the two portions of the skin. When the body is a vehicle such as an aircraft, there are any number of configurations that may be used. The first electrode could comprise the fuselage, with the second electrode comprising the wings. Alternatively, the first electrode could comprise the skin on a forward portion of the aircraft, with the second electrode comprising the skin of an aft portion. Likewise, the first electrode could comprise the skin of a ventral (lower) portion of the aircraft and with the second electrode comprising a dorsal (upper) portion.

In another embodiment in which a portion of the skin is used as the first electrode, a separate second electrode may be provided. In such instances, the entire skin may act as the first electrode. When the body is a vehicle, such as an aircraft or ship, the second electrode may be grounded to the atmosphere or sea, respectively, or may be connected to the second pole of the RF power source. In one such embodiment for a vehicle or other body, the second electrode comprises a high porosity screen generally parallel to and between the skin and the screen. Suitably a spacing of at least one centimeter is used. Alternatively, such a screen can be essentially coextensive with the insulated skin of the vehicle which is acting as the first electrode.

An alternative particularly applicable to aircraft is to use essentially the entire metallic skin of the aircraft as the first electrode, with the second electrode comprising a conductive wire which is insulated from the metallic skin and is trailed in the atmosphere behind the aircraft. In this manner, the surrounding atmosphere is established as a grounded reference plane.

Another embodiment is applicable when the vehicle is an aircraft powered by one or more jet engines. The engines are electrically insulated from the rest of the aircraft. Such jet engines generally have an exhaust containing partially ionized gases when under power. In this case, the metallic skin of the rest of the aircraft is used as the first electrode and the partially ionized gases of the exhaust are used as the second electrode. Again, as discussed above, the surrounding atmosphere is thus established as a grounded reference plane. In addition, the exhaust portion of the jet engines can be surrounded with a suitable circular biasing electrode.

In like manner, when the body to which the plasma is being applied is a ship in water, the water can be utilized as the grounded second electrode. In such a case, at least a portion of the superstructure above the water line would be connected to the RF power source and used as the first electrode. This works particularly well when the surrounding water is highly conductive salt water. If the ship is in fresh water which is not sufficiently conductive to maintain the plasma, then the wake of the ship can be seeded with a suitable salt, such as an alkali metal salt, to increase the conductivity and allow the utilization of the high conductivity wake as the second electrode.

In a particular embodiment of the present invention, such a layer of plasma is applied to a moving vehicle, such as an aircraft, ship or car, to reduce the drag and otherwise improve the aerodynamic characteristics of the atmosphere boundary layer on the vehicles. This is accomplished by reducing the level of boundary layer turbulence and by suppressing the formation of turbulent vortices.

By turning the plasma on and off, and varying the intensity of the plasma through the input power density and the applied RF voltage, it is possible to vary the drag coefficient of an aircraft from the normal value without the plasma layer, to values which may be much lower than those normally encountered. The plasma would tend to be swept along with the aerodynamic boundary layer flow, and would tend to accumulate in areas of stagnation or in vortices, thus making these aerodynamically drag-producing structures subject to an electric field, which may be manipulated by auxiliary or control electrodes on the surface of the aircraft.

In addition to reducing the drag and manipulating the geometry and position of vortices and areas of stagnant air flow, the boundary layer may be either speeded up or slowed down by producing traveling electrostatic peristaltic waves along the direction of movement of the aircraft. To accomplish this, the surface of the aircraft is covered with a series of insulated strip electrodes, oriented perpendicular to the normal aerodynamic flow of the boundary layer gases over the aircraft. These strip electrodes can then be energized in sequence, to induce the generation of peristaltic plasma waves along the surface of the aircraft. When such peristaltic waves are generated from front to back on the aircraft, they exert an acceleration of the plasma in the boundary layer, thus making the flow more laminar, and discouraging the formation of vorticity. On the other hand, if such waves are generated from back to front on the aircraft, then the action would work against the aerodynamic flow and could increase the drag on the aircraft, thus producing a braking effect on the motion of the aircraft though the atmosphere. Thus, the peristaltic waves can be used to either accelerate or decelerate the aircraft.

Various elaborations of this plasma-related boundary layer control are also possible. For example, the surface of the aircraft or vehicle can be fitted with a series of parallel insulated electrodes, the contours of which are perpendicular to the most laminar and least turbulence-producing boundary layer flow over the aircraft, as determined by wind tunnel tests. Phased excitation of these contoured parallel insulated electrodes could provide a body force accelerating the boundary layer flow over the aircraft in a direction which is least likely to lead to turbulence and vortex formation. Such manipulation of the boundary layer by electrostatic body forces may, in addition, have the effect of raising the Reynolds number for transition to turbulent flow both locally, and for the aircraft or vehicle as a whole.

If no peristaltic effect is desired, then the electrodes can be oriented in any suitable direction on the aircraft, and all powered simultaneously to create a uniform steady-state plasma.

The electrodes should be arranged in parallel strips on the surface of the aircraft or other vehicle with adjacent strips being operated at radio frequency voltages 180° out of phase with each other. The RF voltages should be sufficiently high such that RMS electric fields of 10 kilovolts per centimeter (kV/cm) or higher are generated above the surface of the vehicle suitably to a height of about one centimeter or more.

The width of the individual strip electrodes should be wide enough to create a uniform plasma layer over the surface of the vehicle. The strip electrodes can be oriented on the surface of the vehicle as a matter of convenience, in a quasi-parallel pattern, or the electrodes can be placed parallel or perpendicular to the velocity vector of the gas in the boundary layer flowing over the surface of the vehicle. The width of the individual strip electrodes can be adjusted over the surface of the aircraft, in such a way as to produce dense plasma where it is most needed, and more rarified plasma where that is satisfactory for the intended application of the plasma layer.

In addition, the plasma may be generated on the surface of a body, such as an aircraft, to prevent the formation of ice and to remove ice present on the body.

The glow discharge plasma may also be generated on the surface of a body, such as a vehicle at night or in low visibility conditions, to make the body more visible.

The apparatus required to generate a one atmosphere glow discharge plasma around a body includes a low-frequency RF power supply capable of operating from below about 500 Hz up to at least about 10 kHz, or even up to about 30 kHz, at RMS voltages up to about 20 kV. One pole of the power supply is connected to the first electrode, and the other is connected to the second electrode, or grounded, as discussed above.

These connections should be made through an impedance matching network, the function of which is to minimize the reactive power in the RF circuit. Such an impedance matching network can broaden the range of operating frequency and other parameters over which the desirable uniform (as opposed to filamentary) glow discharge is observed. The parameters of such a matching network are adjusted for the most stable, uniform operation of the glow discharge. This condition can occur when the reactive power of the plasma reactor is minimized.

Tests conducted on a parallel plate uniform glow discharge plasma reactor operating at atmospheric pressure indicated that such glow discharges could be maintained by average power densities ranging from below 10 milliwatts per cubic centimeter to values higher than 100 milliwatts per cubic centimeter. On the basis of these experiments, it is reasonable to suppose that a power density of about 50 milliwatts per cubic centimeter may be required to maintain a layer of plasma surrounding an aircraft. If the aircraft has a total surface area of 500 square meters, and if the layer of plasma is two centimeters thick, 10 cubic meters of plasma would need to be generated at 50 milliwatts per cubic centimeter. This would require an energy input to generate such a plasma of 500 kW, a power level about one percent of the total shaft horsepower generated by the jet engines of typical aircraft. Thus, there appears to be no reason, on energetic grounds, why full-scale aircraft should not be able to supply the power requirements for generating such a uniform plasma over their surface, at an energy cost in shaft horsepower that is only a few percent of that developed for their flight requirements. Even in an extreme case, the mass of the electrical power generator and power supplies required to produce the high voltage RF needed to produce the plasma should require no more than about 1 kilogram per kilowatt, thus burdening the aircraft in the example above with no more than about 500 kilograms of additional equipment. In practice, this is likely to be a very generous overestimate of the mass of a single unit generating half a megawatt of electrical and RF power.

An electric field established between the metallic electrodes must be strong enough to electrically break down the gas used, and is much lower for helium and argon than for atmospheric air. The RF frequency should be within a suitable range, as discussed above, since if it is too low, the discharge will not initiate, and if it is too high, the plasma will form filamentary discharges between the electrodes. Within this suitable frequency band a uniform slow discharge plasma forms without filamentary discharges.

Electric fields employed in a one atmosphere, uniform glow discharge plasma reactor are only a few kilovolts per centimeter, values which, if D.C., would usually be too low to electrically break down the background gas. Gases such as helium and air will break down under such low electric fields, however, if the positive ion population is trapped between the two parallel or uniformly spaced electrodes. This greatly increases the ions' lifetime in the plasma, while at the same time the electrons are free to travel to the insulated electrode plates where they recombine or build up a surface charge. The most desirable uniform one atmosphere glow discharge plasma is therefore created when the applied frequency of the RF electric field is high enough to trap the ions between the electrodes, but not so high that the electrons are also trapped during a half cycle of the R.F. voltage. The electrons may be trapped by ambipolar electrostatic forces.

If the RF frequency is so low that both the ions and the electrons can reach the boundaries and recombine, the particle lifetimes will be short and the plasma will either not initiate or form a few coarse filamentary discharges between the plates. If the applied frequency is in a narrow band in which the ions oscillate between the electrodes, they do not have time to reach either boundary during a half period of oscillation and be confined for long times. If the more mobile electrons are still able to leave the plasma volume and impinge on the boundary surfaces, then the desirable uniform plasma is produced. If the applied RF frequency is still higher so that both electrons and ions are trapped in the discharge, then the discharge becomes electrically polarized and forms a filamentary plasma.

The following examples are illustrative of the invention but they should not in any way be considered as limiting the invention thereto.

EXAMPLE 1

Without being limited to any particular theory, it is believed that a relationship exists between the electrode spacing, the RMS electrode voltage, the ion mobility, and the applied frequency which results in trapping ions but not electrons between the two electrodes, and produces the desired uniform one atmosphere glow discharge plasma.

In accordance with this theory, FIG. 1 presents a schematic of an atmospheric glow discharge plasma reactor in which the plasma is generated between upper plate electrode 50 and grounded lower plate electrode 52 connected to opposite poles of an R.F. source 54. In the configuration of FIG. 1, a Cartesian coordinate system is applied as shown, with the applied electric field in the x-direction. The maximum amplitude of the electric field between the grounded lower electrode 52 and the upper electrode 52 is $E_0$, and the separation of the electrodes is the distance d.

The electric field between the electrodes shown on FIG. 1 is given by $$E=(E_0 \sin\omega t, 0, 0). \tag{1}$$

It is assumed that the one atmosphere glow discharge operates in a magnetic field free plasma. The equation of motion for the ions or electrons between the two plates is given by a Lorentzian model, in which the electrons and ions collide only with the neutral background gas and, on each collision, give up all the momentum in the direction of the electric field they acquired from the RF electric field since the last collision with the neutral gas. The equation of motion for the ions or electrons in the Lorentzian model is given by $$F = ma = -mv_c v - eE, \qquad (2)$$

where the first term on the right hand side is the Lorentzian collision term, according to which the momentum mv is lost with each collision that occurs with a collision frequency $v_c$. The x component of Eq. 2 is given by $$m\frac{d^2X}{dt^2} + mv_c\frac{dx}{dt} = eE_0 \sin\omega t, \qquad (3)$$

where the electric field E from Eq. 1 has been substituted into the right hand side of Eq. 2. The general solution to Eq. 3 is $$x = C_1 \sin\omega t = C_2 \cos\omega t, \qquad (4)$$

where the constants $C_1$ and $C_2$ are given by $$C_1 = -\frac{eE_0}{m}\frac{1}{(\omega^2 + v_c^2)}, \qquad (5)$$

and $$C_2 = -\frac{v_c eE_0}{\omega m}\frac{1}{(\omega^2 + v_c^2)}. \qquad (6)$$

The one atmosphere helium glow discharge is operated at frequencies between $\omega/2\pi = 1$ and 30 kHz, where, for helium at one atmosphere, $$v_{ci} \approx 6.8 \times 10^9 \text{ ion collisions/sec.}, \qquad (7a)$$

and $$v_{ce} \approx 1.8 \times 10^{12} \text{ electron coll./sec.} \qquad (7b)$$

The collision frequency for ions and electrons given by Eqs. 7a and 7b is much greater than the RF frequency, $v_c \gg \omega$. The relation $v_c \gg \omega$ for ions and electrons, implies that $C_2$ is much greater than the constant $C_1$, or $$C_2 \approx -\frac{eE_0}{m\omega v_c} \gg C_1 \qquad (8)$$

The time dependent position of an ion or an electron in the electric field between the plates is given by substituting Eq. 8 into Eq. 4, to obtain $$x(t) \approx -\frac{eE_0}{m\omega v_c}\cos\omega t. \qquad (9)$$

The RMS displacement of the ion or electron during a half cycle is given by $$x_{rms} = \frac{2}{\pi}\frac{eE_0}{m\omega v_c} \text{ meters.} \qquad (10)$$

If v is the driving frequency, in hertz, and $V_{rms}$ is the RMS voltage applied to the plate electrodes, then the radian RF frequency is given by $$\omega = 2\pi v, \qquad (11)$$

and the electric field between the plates can be approximated from the RMS voltage $V_{rms}$ applied to the plate electrodes, $$E_0 = \frac{V_{rms}}{d}. \qquad (12)$$

If the charge in question moves across the entire discharge width d between the plates, on the average, during one full cycle, then this would provide $$x_{rms} \approx \frac{d}{2}. \qquad (13)$$

In accordance with Equation 13 the RMS displacement of the ions has to be less than half the clear spacing in order to have a buildup of charge between the plates, that is, $x_{rms} < d/2$ to have a charge buildup. Substituting Eqs. 11 to 13 into Eq. 10 yields the relationship $$\frac{d}{2} \approx \frac{eV_{rms}}{\pi^2 m v v_c d}. \qquad (14)$$

Solving for the critical frequency $v_0$ above which charge buildup should occur in the plasma volume, gives $$v_0 \approx \frac{2eV_{rms}}{\pi^2 m v_c d^2} \text{ Hz.} \qquad (15)$$

In Eq. 15, the collision frequency $v_c$ for helium is approximately given by Eqs. 7a or 7b for ions or electrons, respectively, at one atmosphere, and the RMS voltage is that which bounds the upper and lower limit of the uniform discharge regime.

For helium ions, the following experimental conditions were used:

$V_{rms} \approx 1000$ volts (threshold for discharge initiation)

$d = 1.25 \times 10^{-2}$ meters $v_{ci} = 6.8 \times 10^9$/sec

This gives, for singly charged helium ions:

$v_0 > 4.6$ kHz, theoretical

This was in good agreement with the experiment which gave:

$v_0 = 3.0$ kHz, experimental.

For electrons, $v_{ce} = 1.8 \times 10^{12}$/sec, and $V_{rms} \approx 1000$ volts.

The threshold for confinement of both species is:

$v_0 \approx 127$ kHz, which is consistent with the observed formation of filamentary discharges below 100 kHz.

For helium, at one atmosphere pressure the voltage $V_o$ should be greater than about 1.5 $kV_{rms}$, and the frequency v between about 1 kHz and about 3 kHz to produce an electric field E greater than about 1 $kV_{rms}$/cm. Preferably, the minimum electric field E for helium is about 2 $kV_{rms}$/cm.

For air, at one atmosphere pressure, the voltage $V_o$ should be greater than about 5 $kV_{rms}$, and the frequency v should be between about 1 kHz and about 2.5 kHz. Preferably, the minimum electric field E for oxygen is about 8 $kV_{rms}$/cm.

The above formulae are applicable to air and other gases and mixtures thereof by substituting appropriate value for such gases from scientific published literature or standard reference manuals, like the Handbook of Chemistry and Physics, CRC Press, 69th Edition, 1988–1989, or others. Publications from the American Institute of Electrical Engineers or the I.E.E.E. may also be useful sources for information.

EXAMPLE 2

Figure 2:
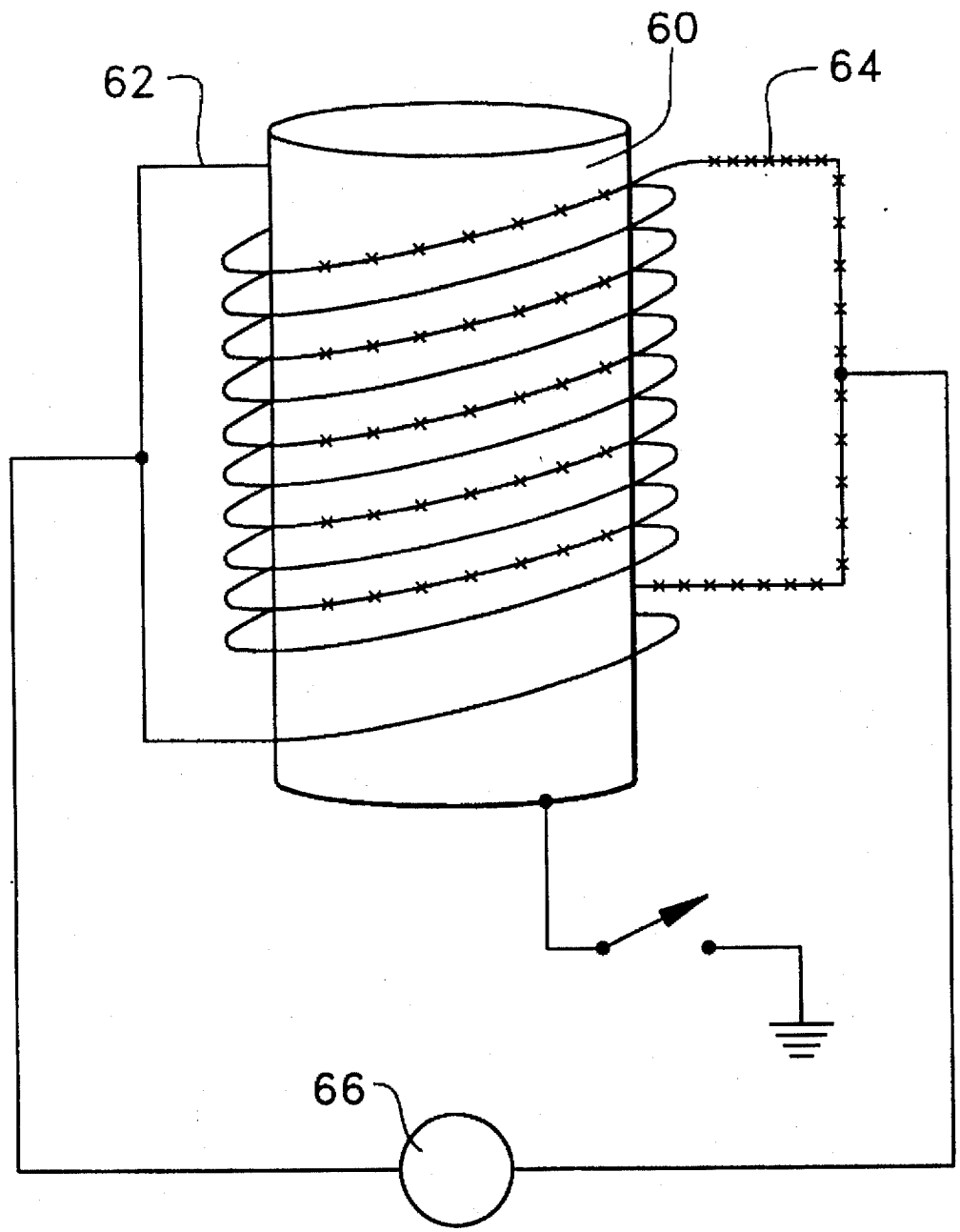
FIG. 2 is a schematic representation of a tubular body with apparatus for generating a uniform glow discharge plasma on the tubular body in accordance with the present invention.

A laboratory simulation of apparatus made in accordance with the present invention was prepared, as shown schematically in FIG. 2. The body to be coated with a uniform glow discharge plasma was a length of 2-inch diameter copper pipe 60 which may be grounded as shown. Strip electrodes 62 and 64 were provided in the form of wires surrounded by plastic insulation. Two parallel lengths of insulated wires were spiral wrapped side-by-side around the length of the copper pipe. To distinguish the two spirals in the drawing, electrode 64 is marked along its length with x's. In this case, the thickness of the insulation maintained a uniform spacing between the copper wires. The two strip electrodes were connected to an RF power source 66. For purposes of this test, the test apparatus was placed inside a closed chamber filled with helium gas at one atmosphere pressure. As discussed above, helium requires a lower voltage than air for generating a plasma, and it is for this reason that helium was used in this test. When power was applied to the circuit, a uniform violet glow discharge plasma was observed covering the coated copper body. It is the steady violet glow which shows that a uniform glow discharge plasma has been established.

Figure 3:
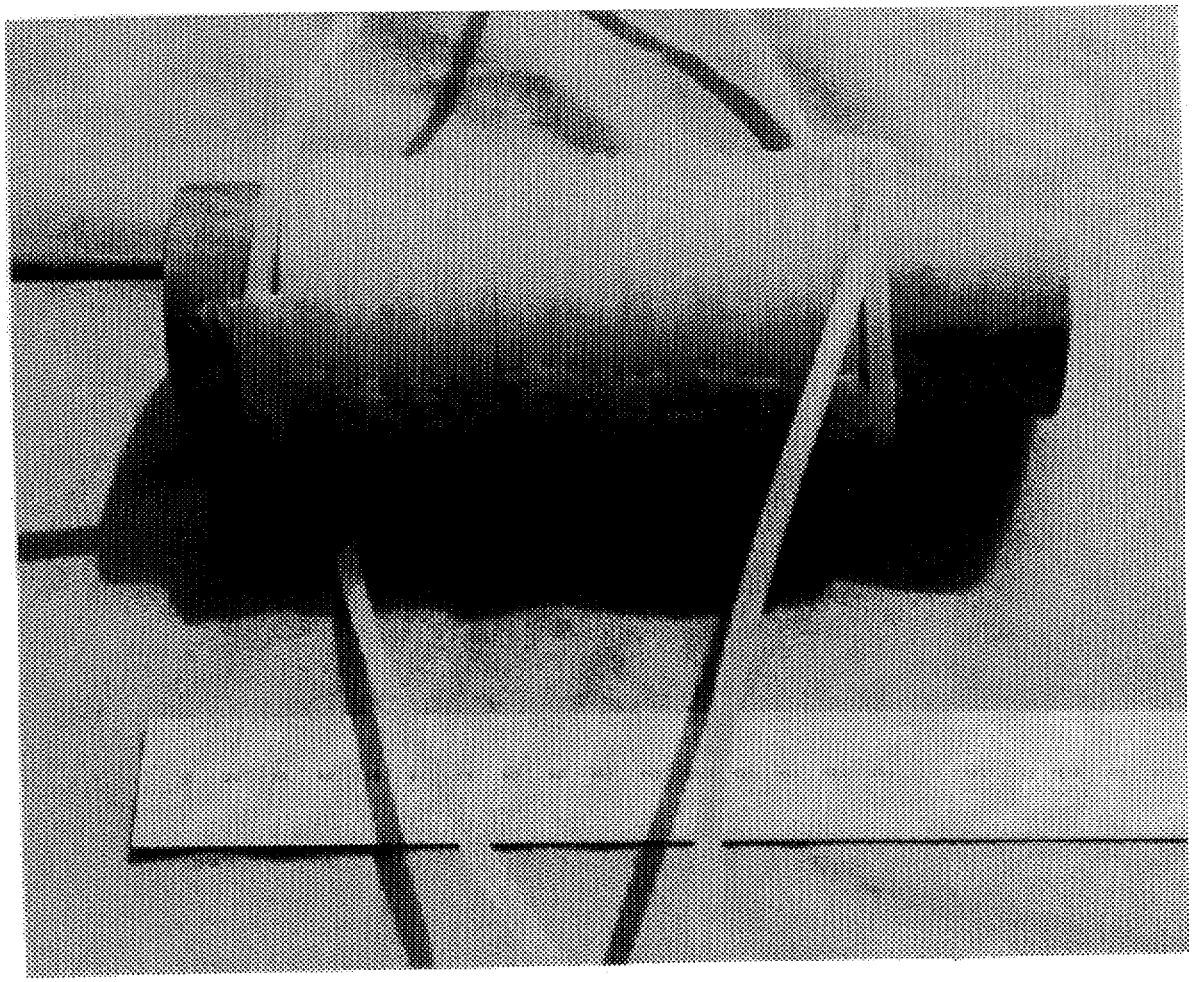
FIG. 3 is a photograph of an apparatus corresponding to that depicted schematically in FIG. 2.
Figure 4:
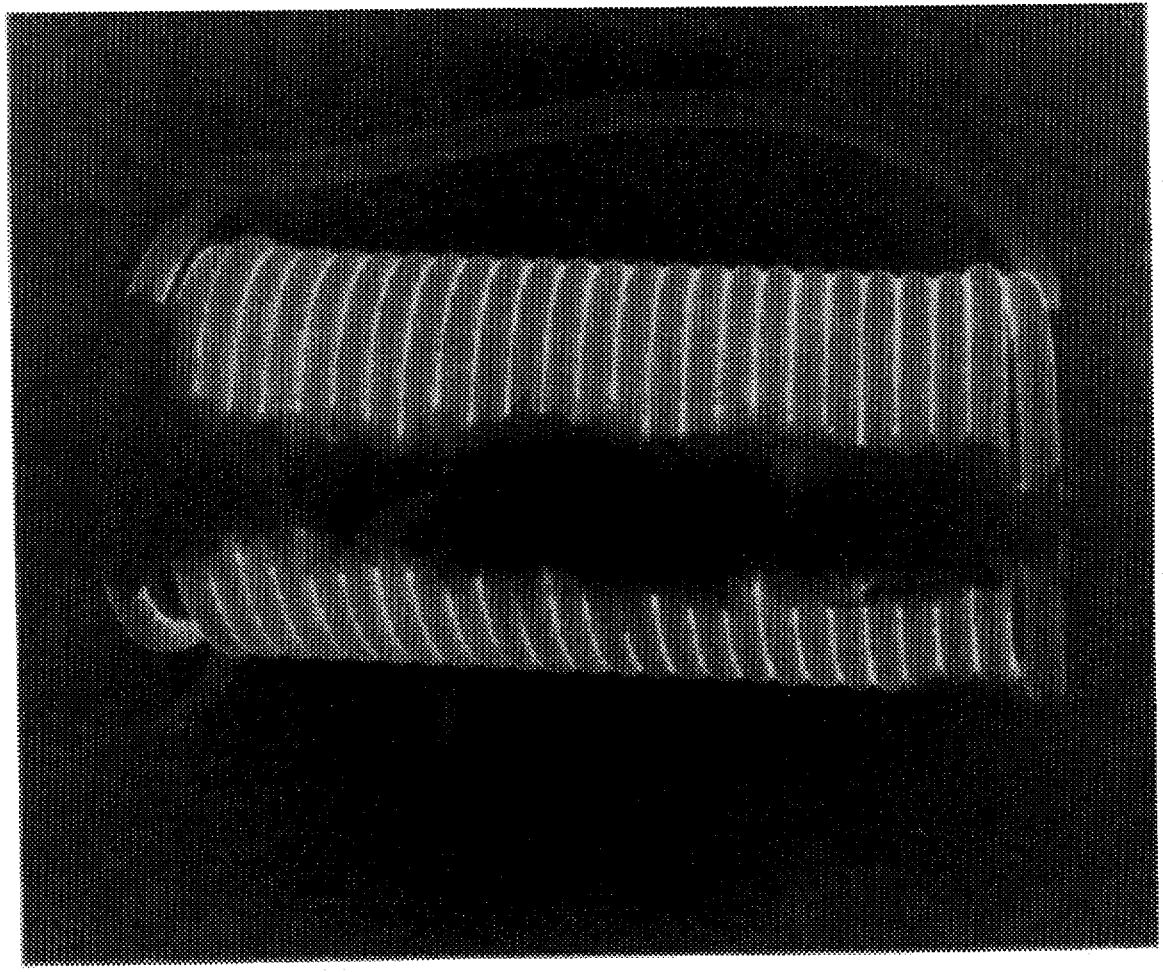
FIG. 4 is a photograph of the apparatus shown in FIG. 3 under power, showing the body of the apparatus coated with a plasma in accordance with the present invention.

FIG. 3 and 4 are photographs of an apparatus in accordance with that depicted schematically in FIG. 2. FIG. 3 shows the apparatus unpowered and FIG. 4 shows the apparatus under power with a visible uniform violet glow discharge plasma covering the body of the apparatus.

What is claimed is:

1. A method for generating a steady-state one atmosphere glow discharge plasma which covers a surface of a body in a gas, wherein said body has a skin on which are disposed a plurality of insulated strip electrodes which are spaced from and generally parallel to each other, said method comprising the steps of:

providing a first electrode terminal including first electrode strips disposed on the skin of said body, and a second electrode terminal including second electrode strips disposed on the skin of said body and which are adjacent to said first electrode strips, wherein said second electrode terminal is electrically isolated from said first electrode terminal, connecting said first electrode terminal to a first pole of a radio frequency (RF) power source which has first and second opposite poles, and connecting the second electrode terminal either to the second pole of said RF power source or to ground, and generating said steady-state one atmosphere glow discharge plasma by utilizing said RF power source to energize said first electrode terminal relative to said second electrode terminal with an RF driving voltage at an applied frequency, wherein the RF driving voltage is high enough to generate an electric field which covers the surface of the body, and the applied frequency produces an RF electric field which is high enough to trap positive ions of the plasma on electric field lines between the two electrode terminals, but not so high that electrons of the plasma are also trapped during a half cycle of oscillation of the RF driving voltage, producing a steady-state one atmosphere glow discharge plasma in the gas which covers the surface of the body.

2. The method of claim 1 which further includes the step of generating said plasma over a body which is a vehicle.

3. The method of claim 2 wherein the vehicle is moving along a velocity vector, and which further includes the step of orienting said strip electrodes generally parallel to the velocity vector of the movement of the vehicle.

4. The method of claim 2 wherein the vehicle is moving along a velocity vector, and which further includes the step of orienting said strip electrodes generally perpendicular to the velocity vector of the movement of the vehicle.

5. The method of claim 1 which further includes the step of simultaneously energizing all of said strip electrodes to generate said plasma.

6. The method of claim 1 which further includes the step of energizing said strip electrodes in a predetermined sequence to generate said plasma.

7. A method of affecting the speed of a vehicle relative to a surrounding atmosphere in which the vehicle is moving, the method comprising the steps of generating a steady-state one atmosphere glow discharge plasma on a surface of said vehicle by the method of claim 1, and energizing said strip electrodes in a peristaltic sequence which affects the speed of said vehicle relative to said surrounding atmosphere.

8. The method of claim 1 wherein the glow discharge plasma produced in the gas covers the surface of the body and the electrode terminals.

9. The method of claim 1 wherein the applied frequency is about 500 Hz to about 30 kHz.

10. The method of claim 9 wherein the RF driving voltage is about 20 kV.

11. A method for generating a steady-state one atmosphere glow discharge plasma which covers a surface of a body in a gas, wherein said body has a metallic skin covered with an insulating layer, said method comprising the steps of:

providing a first electrode terminal associated with a first portion of said metallic skin, and a second electrode terminal associated with a second portion of said metallic skin which is spaced from said first portion of said metallic skin and electrically isolated from said first electrode terminal, connecting said first electrode terminal to a first pole of a radio frequency (RF) power source which has first and second opposite poles, and connecting the second electrode terminal either to the second pole of said RF power source or to ground, and generating said steady-state one atmosphere glow discharge plasma by utilizing said RF power source to energize said first electrode terminal relative to said second electrode terminal with an RF driving voltage at an applied frequency, wherein the RF driving voltage is high enough to generate an electric field which covers the surface of the body, and the applied frequency produces an RF electric field which is high enough to trap positive ions of the plasma on electric field lines between the two electrode terminals, but not so high that electrons of the plasma are also trapped during a half cycle of oscillation of the RF driving voltage, producing a steady-state one atmosphere glow discharge plasma in the gas which covers the surface of the body.

12. A method for decreasing the drag coefficient and the production of vorticity on a vehicle moving through an atmosphere comprising generating a steady-state one atmosphere glow discharge plasma above a surface of said vehicle by the method of claim 1 or claim 11.

13. The method of claim 11 which further includes the step of using essentially the entire metallic skin of the body as the first electrode.

14. The method of claim 11 which further includes the step of generating said plasma over a body which is a vehicle.

15. The method of claim 14 which further includes the step of generating said plasma over a body which is an aircraft.

16. The method of claim 11 wherein the body is a ship having a metallic skin in water, and which further includes the steps of using a portion of the skin of the ship above the water level as the first electrode terminal and using the water as the second electrode terminal.

17. An apparatus for generating a steady-state one atmosphere glow discharge plasma which covers a surface of a body in a gas, the apparatus comprising:

a radio frequency (RF) power source which has first and second opposite poles, a first electrode terminal associated with a first portion of said body and connected to a first of the poles of the RF power source, and a second electrode terminal associated with a second portion of said body which is separate from the first portion of said body and electrically isolated from said first electrode terminal, and which is connected either to a second of the poles of the RF power source or to ground, wherein said RF power source energizes said first electrode terminal relative to said second electrode terminal with an RF driving voltage at an applied frequency, wherein the RF driving voltage is high enough to generate an electric field which covers the surface of the body, and wherein the applied frequency produces an RF electric field which is high enough to trap positive ions of the plasma on electric field lines between the two electrode terminals, but not so high that electrons of the plasma are also trapped during a half cycle of oscillation of the RF driving voltage, thereby generating the steady-state one atmosphere glow discharge plasma in the gas which covers the surface of said body.

18. The apparatus of claim 17 wherein said body has a skin and wherein said first and second electrode terminals comprise insulated strip electrodes disposed on said skin, wherein said electrodes are spaced from and generally parallel to each other, wherein adjacent strip electrodes are connected to the opposite first and second poles of the RF power source, and wherein the strip electrodes connected to the first pole comprise the first electrode terminal and the strip electrodes connected to the second pole comprise the second electrode terminal.

19. The apparatus of claim 18 further comprising means to energize said strip electrodes in a predetermined sequence.

20. The apparatus of claim 17 wherein said body comprises a metallic skin covered with an insulating layer, and wherein the first electrode terminal comprises at least a portion of said insulated metallic skin, and wherein the second electrode terminal is spaced from the first electrode terminal with the insulating layer on the first electrode terminal interposed between said first and second electrode terminals.

21. The apparatus of claim 17 wherein the glow discharge plasma produced in the gas covers the surface of the body and the electrode terminals.

22. The apparatus of claim 17 wherein the applied frequency is about 500 Hz to about 30 kHz.

23. The apparatus of claim 22 wherein the RF driving voltage is about 20 kV.

* * * * *